(12) United States Patent
Cheng et al.

(10) Patent No.: US 9,773,819 B2
(45) Date of Patent: Sep. 26, 2017

(54) ARRAY SUBSTRATE, ITS MANUFACTURING METHOD, DISPLAY PANEL AND DISPLAY DEVICE

(71) Applicant: BOE TECHNOLOGY GROUP CO., LTD., Beijing (CN)

(72) Inventors: Hongfei Cheng, Beijing (CN); Yong Qiao, Beijing (CN); Jianbo Xian, Beijing (CN); Wenbo Li, Beijing (CN); Pan Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/769,405

(22) PCT Filed: Nov. 27, 2014

(86) PCT No.: PCT/CN2014/092319
§ 371 (c)(1),
(2) Date: Aug. 20, 2015

(87) PCT Pub. No.: WO2016/004722
PCT Pub. Date: Jan. 14, 2016

(65) Prior Publication Data
US 2016/0252793 A1   Sep. 1, 2016

(30) Foreign Application Priority Data
Jul. 9, 2014   (CN) .......................... 2014 2 0378231

(51) Int. Cl.
*H01L 27/12*   (2006.01)
*G02F 1/1362*  (2006.01)
(Continued)

(52) U.S. Cl.
CPC .......... *H01L 27/124* (2013.01); *G02F 1/1362* (2013.01); *G02F 1/1368* (2013.01);
(Continued)

(58) Field of Classification Search
CPC ........... G02F 1/13628; G02F 1/134309; G02F 2001/134318; G02F 2001/136218; H01L 27/124; H01L 29/78633
See application file for complete search history.

(56) References Cited

U.S. PATENT DOCUMENTS

2001/0046019 A1 * 11/2001 Lee .................. G02F 1/134363
                                                          349/141
2002/0051114 A1 *  5/2002 Kwak ................ G02F 1/1309
                                                          349/192
(Continued)

FOREIGN PATENT DOCUMENTS

CN         101211084 A       7/2008
CN         102004360 A       4/2011
(Continued)

OTHER PUBLICATIONS

Written Opinion and International Search Report regarding International Application No. PCT/CN2014/092319.

*Primary Examiner* — Fei Fei Yeung Lopez
(74) *Attorney, Agent, or Firm* — Harness, Dickey & Pierce, P.L.C.

(57) ABSTRACT

The present disclosure provides an array substrate, a display panel, a display device and a method for manufacturing the array substrate. The array substrate includes: a plurality of gate lines and a plurality of data lines arranged in a crisscross manner on a base substrate, so as to define a plurality of subpixels; and a common electrode arranged opposite to each of the plurality of subpixels. At least one of the subpixels is provided with a common electrode line connected to the common electrode at an identical subpixel region.

19 Claims, 7 Drawing Sheets

(51) Int. Cl.
*G02F 1/1333* (2006.01)
*G02F 1/1368* (2006.01)
*H01L 29/66* (2006.01)
*H01L 29/786* (2006.01)
*G02F 1/1343* (2006.01)

(52) U.S. Cl.
CPC .... *G02F 1/13439* (2013.01); *G02F 1/133345* (2013.01); *G02F 1/134309* (2013.01); *G02F 1/136227* (2013.01); *G02F 1/136286* (2013.01); *H01L 27/1222* (2013.01); *H01L 27/1225* (2013.01); *H01L 27/1248* (2013.01); *H01L 27/1259* (2013.01); *H01L 29/66765* (2013.01); *H01L 29/66969* (2013.01); *H01L 29/7869* (2013.01); *H01L 29/78633* (2013.01); *H01L 29/78669* (2013.01); *G02F 1/1343* (2013.01); *G02F 2001/134318* (2013.01); *G02F 2001/134345* (2013.01); *G02F 2001/136218* (2013.01); *G02F 2001/136295* (2013.01)

(56) References Cited

U.S. PATENT DOCUMENTS

| | | | | |
|---|---|---|---|---|
| 2008/0074572 | A1* | 3/2008 | Kim | G02F 1/134363 349/44 |
| 2009/0261334 | A1* | 10/2009 | Ahn | G02F 1/134363 257/59 |
| 2010/0283930 | A1* | 11/2010 | Park | G02F 1/1323 349/46 |
| 2011/0216278 | A1 | 9/2011 | Nagano et al. | |

FOREIGN PATENT DOCUMENTS

| | | |
|---|---|---|
| CN | 102033365 A | 4/2011 |
| CN | 103765306 A | 4/2014 |
| CN | 203941365 U | 11/2014 |
| JP | 2010139600 A | 6/2010 |

\* cited by examiner

ARRAY SUBSTRATE, ITS MANUFACTURING METHOD, DISPLAY PANEL AND DISPLAY DEVICE

CROSS-REFERENCE TO RELATED APPLICATION

The present application is the U.S. national phase of PCT Application No. PCT/CN2014/092319 filed on Nov. 27, 2014, which claims a priority of the Chinese patent application No. 201420378231.1 filed on Jul. 9, 2014, which is incorporated herein by reference in its entirety.

TECHNICAL FIELD

The present disclosure relates to the field of display technology, in particular to an array substrate, its manufacturing method, a display panel and a display device.

BACKGROUND

Thin film transistor liquid crystal display (TFT-LCD) has become a mainstream product on the market due to its features such as being light and thin, being space-saving, low power consumption, and low radiation. The liquid crystal display technique has currently been widely used in TVs, mobile phones and public information displays. For these products, the image quality has attracted more and more attentions, and the display evenness is an important one of the various parameters.

A liquid crystal display device includes an array substrate, a color filter substrate, and a liquid crystal layer arranged therebetween. Data lines and gate lines are arranged in a crisscross manner on the array substrate, so as to define subpixels at a display region of the array substrate. Each subpixel is provided with a TFT, a gate electrode of which is connected to the gate line, a drain electrode of which is connected to a pixel electrode, and a source electrode of which is connected to the data line. Under the collective action of a gate driving signal from the gate line and a data signal from the data line, an electric field is formed at the liquid crystal layer through the pixel electrode and a common electrode, and thereby liquid crystal molecules are controlled by the electric field to deflect so as to achieve the display.

For a traditional liquid crystal display device with a fringe field switching (FFS) mode, the pixel electrode and the common electrode are both arranged on the array substrate, and each subpixel is provided with one pixel electrode. The common electrode and the pixel electrode are insulated from each other and cover the entire display region. A common electrode line is arranged at a periphery of the display region of the array substrate, and connected to the common electrode so as to provide a signal thereto. However, there is the following defect in the traditional liquid crystal display device with the FFS mode. The common electrode uses a whole indium tin oxide (ITO) electrode, and due to its resistance, there is a great voltage drop of a common electrode signal between a region adjacent to the common electrode line and a region away from the common electrode line. As a result, the display evenness will be adversely affected.

SUMMARY

An object of the present disclosure is to provide an array substrate, its manufacturing method, a display panel and a display device, so as to reduce a voltage drop of a common electrode signal, thereby to improve the display evenness.

In one aspect, the present disclosure provides in one embodiment an array substrate, including: a base substrate; a plurality of gate lines and a plurality of data lines arranged in a crisscross manner on the base substrate, so as to define a plurality of subpixels; and a common electrode arranged opposite to each of the plurality of subpixels. At least one of the subpixels is provided with a common electrode line connected to the common electrode at an identical subpixel region.

Alternatively, the array substrate further includes a pixel electrode arranged within each of the plurality of subpixels, and a TFT arranged within each of the plurality of subpixels and connected to the corresponding data line, gate line and pixel electrode.

Alternatively, a structure of the common electrode and the common electrode line is alternately arranged within the plurality of the subpixels in each row.

Alternatively, the common electrode line is arranged at an identical layer to, and insulated from, the gate line, and the common electrode line is arranged at a layer different from the common electrode and connected to the common electrode through a via-hole in an insulating layer between the common electrode line and the common electrode.

Alternatively, the common electrode line is arranged parallel to the gate line, and within an identical subpixel, the common electrode line and the gate line are arranged at opposite sides, or an identical side, of the pixel electrode.

Alternatively, the array substrate further includes a first shielding electrode, and projections of the first shielding electrode and the data line onto the base substrate completely or partially overlap each other, or do not overlap each other.

Alternatively, the first shielding electrode is arranged at an identical layer to, and directly connected to, the common electrode line.

Alternatively, the first shielding electrode is arranged at a layer different from the common electrode line, and connected to the common electrode line through a via-hole.

Alternatively, the first shielding electrode is arranged at an identical layer to, and insulated from, the data line.

Alternatively, the array substrate further includes a second shielding electrode, and projections of the second shielding electrode and the gate line onto the base substrate completely or partially overlap each other, or do not overlap each other.

Alternatively, the second shielding electrode is arranged at an identical layer to, and connected to, the common electrode line.

Alternatively, the second shielding electrode is arranged at an identical layer to, and insulated from, the gate line.

Alternatively, the common electrode within the subpixel provided with the common electrode line completely or partially covers, or does not cover, the data lines and/or gate lines defining the subpixel.

Alternatively, the common electrode is provided with a cutout at a position corresponding to the TFT within an identical subpixel.

Alternatively, the common electrode is provided with a first slit.

Alternatively, the pixel electrode is provided with a second slit or the pixel electrode is a plate-like electrode.

In another aspect, the present disclosure provides in one embodiment a display panel including a color filter substrate and the above-mentioned array substrate.

In yet another aspect, the present disclosure provides in one embodiment a display device including the above-mentioned display panel.

In still yet another aspect, the present disclosure provides in one embodiment a method for manufacturing an array substrate, including steps of: providing a base substrate; forming patterns of gate lines and gate electrodes on the base substrate; forming a pattern of data lines. forming a pattern of common electrode lines at a pixel region surrounded by the patterns of the gate lines and data lines; forming a pattern of a passivation layer on the pattern of the common electrode lines; and forming a pattern of common electrodes on the pattern of the passivation layer, the common electrodes being each connected to the common electrode line through a via-hole.

Alternatively, the step of forming the patterns of the gate lines and gate electrodes on the base substrate includes forming a pattern of a first shielding electrode.

Alternatively, the method further includes: forming the common electrode line, the gate lines, the gate electrodes and the first shielding electrodes by a single patterning process; depositing a gate insulating layer onto the base substrate with the gate lines, the gate electrodes, the common electrodes and the first shielding electrodes; depositing a transparent metal oxide conductive layer onto the gate insulating layer, and forming a pattern of pixel electrodes by a single patterning process; depositing a semiconductive layer onto the gate insulating layer, and forming a pattern of an active layer by a single patterning process; depositing a metal layer onto the gate insulating layer, and forming patterns of a source electrode, a drain electrode and the data lines by a single patterning process; depositing the passivation layer onto the source electrode, the drain electrode, the data lines and the pixel electrode; depositing a planarization layer onto the passivation layer, and forming a via-hole in the gate insulating layer, the passivation layer and the planarization layer at a position corresponding to the common electrode line by a single patterning process; and depositing the transparent metal oxide conductive layer onto the planarization layer, and forming the pattern of the common electrodes by a single patterning process, the common electrodes being each connected to the common electrode line through the via-hole.

DETAILED DESCRIPTION

The principles and features of the present disclosure will be described hereinafter in conjunction with the drawings and embodiments. The following embodiments are for illustrative purposes only, but shall not be used to limit the scope of the present disclosure.

In the related art, a common electrode of an array substrate is a whole ITO electrode that covers a display region of the array substrate, and a common electrode signal is provided to the common electrode via a common electrode line arranged at a periphery of the display region, so there is a great voltage drop caused by the common electrode, and thereby the display evenness will be adversely affected. In order to overcome this defect, the preset disclosure provides in the embodiments an array substrate, so as to reduce the voltage drop, thereby to improve the display evenness.

Figure 1:
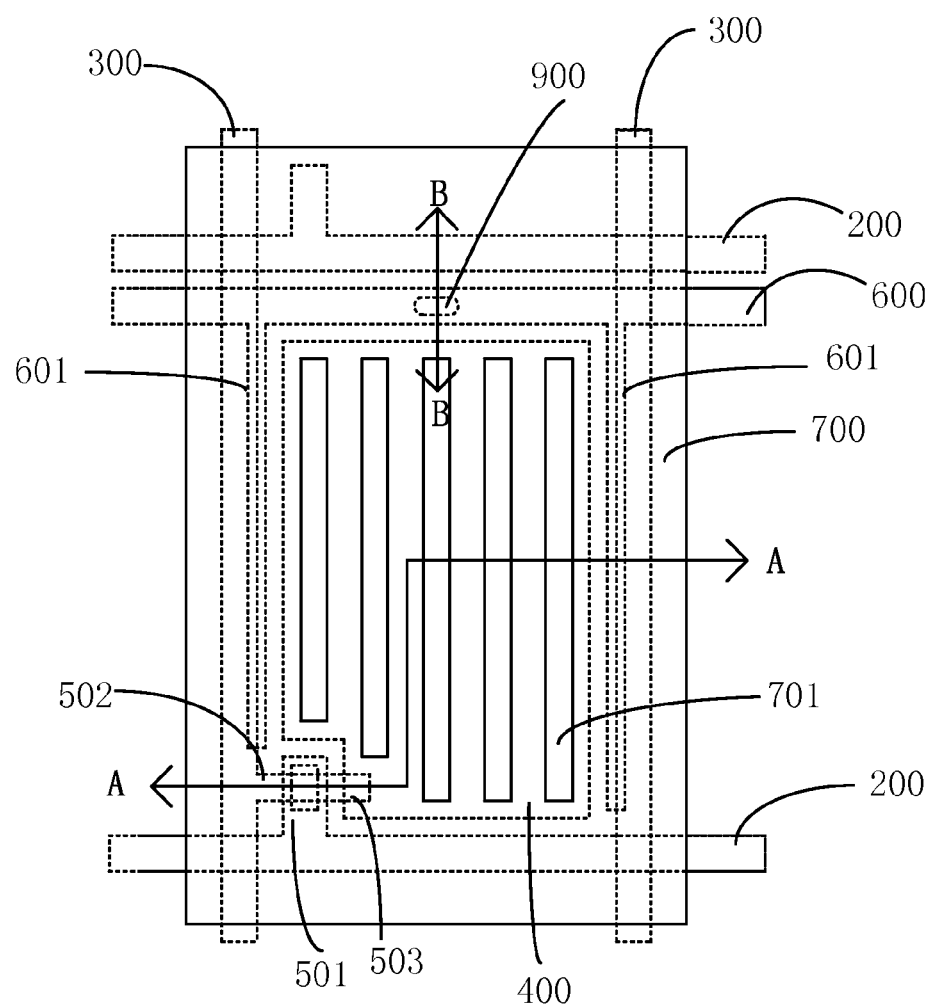
FIG. 1 is a schematic view showing one subpixel of an array substrate according to one embodiment of the present disclosure.
Figure 2:
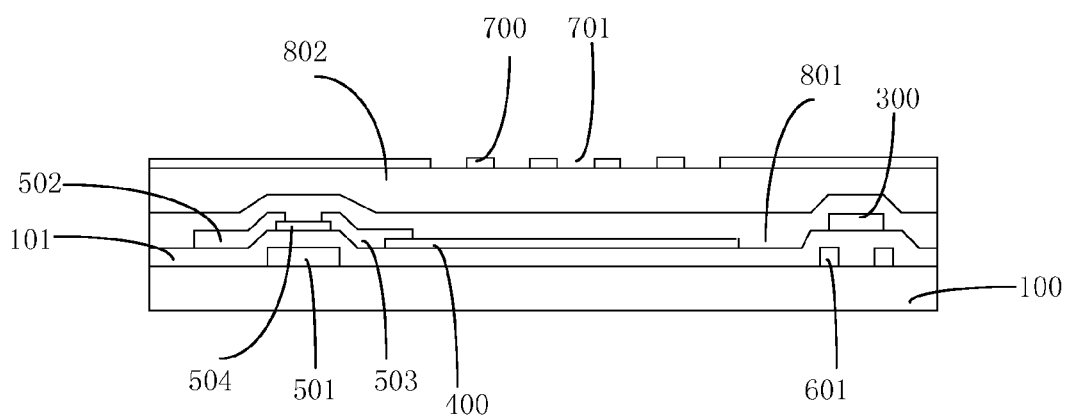
FIG. 2 is a sectional view along line A-A in FIG. 1.
Figure 3:
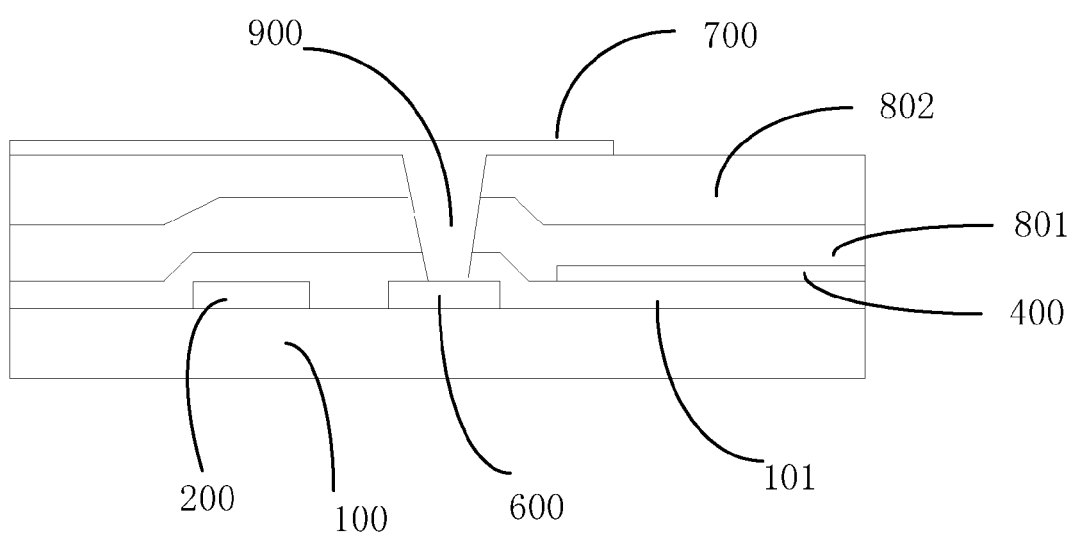
FIG. 3 is a sectional view along line B-B in FIG. 1.

As shown in FIGS. 1-3, the array substrate in the embodiments of the present disclosure includes: a base substrate 100; a plurality of gate lines 200 and data lines 300 arranged in a crisscross manner on the base substrate 100, so as to define a plurality of subpixels; a pixel electrode 400 arranged within each subpixel; a common electrode 700 arranged opposite to, and insulated from, the pixel electrode 400 within each subpixel; and a TFT arranged within each subpixel, a gate electrode 501 of which is connected to the corresponding gate line 200, a source electrode 502 of which is connected to the corresponding data line 300, and a drain electrode 503 of which is connected to the corresponding pixel electrode 400. At least one of the subpixels is provided with a common electrode line 600 connected to the common electrode 700 at an identical subpixel region.

According to the embodiment of the present disclosure, the common electrode line 500 of the array substrate may be arranged within the subpixel, and the common electrode 700 may be separately arranged within the subpixel and connected to the common electrode line 600 within the identical subpixel, so as to provide a signal to the common electrode 700 within the subpixel. As a result, it is able to reduce a voltage drop of a common electrode signal due to the resistance of the common electrode 700, thereby to improve the display evenness.

It should be appreciated that, for the array substrate in the embodiments of the present disclosure, the common electrode 700 and the common electrode line 600 may be separately arranged within each subpixel and connected to each other, and the common electrodes 700 within different subpixels are insulated from each other.

Alternatively, a structure that the common electrodes 700 and the common electrode lines 600 are separately arranged may only provided within a part of the subpixels of the array substrate. For example, the structure of the common electrode lines 600 and the common electrodes 700 may be alternately arranged within the plurality of subpixels. In other words, for two adjacent subpixels, the common electrode 700 and the common electrode line 600 may be arranged separately within one subpixel and connected to each other, while no common electrode line 600 is arranged in the other subpixel. The common electrode in the other subpixel is formed integrally with, and connected to, the common electrode in the one subpixel.

In addition, in one embodiment of the present disclosure, as shown in FIGS. 1-3, the common electrode line 600 is arranged at an identical layer to, and insulated from, the gate line 200. The common electrode line 600 is arranged at a layer different from the common electrode 700, and connected to the common electrode 700 through a via-hole 900 in an insulating layer between the common electrode line 600 and the common electrode 700. The insulating layer includes a gate insulating layer 101, a passivation layer 801 and a planarization layer 802.

According to the embodiments of the present disclosure, the common electrode line 600 and the gate line 200 may be formed at an identical layer and made of an identical material, so as to form the common electrode line 600 within the subpixel as well as the gate lines 200 and the gate electrode 501 of the TFT on the base substrate 100 by a single patterning process. As a result, it is able to simplify the manufacture process.

Of course, it should be appreciated that, in the other embodiments of the present disclosure, the common electrode line 600 and the gate line 200 may be formed at different layers and made of different materials. For example, the common electrode line 600 and the data line 300 may be formed at an identical layer and made of an identical material. In other words, the arrangement mode of the common electrode line 600 mentioned in the embodiments of the present disclosure is merely for illustrative purposes, and the present disclosure is not limited thereto.

In addition, in the embodiments of the present disclosure, the common electrode line 600 is connected to the common electrode 700 through the via-hole 900. In actual application, the common electrode line 600 may be connected to the common electrode 700 in any other ways in accordance with the practical need. For example, the common electrode 700 and the common electrode line 600 may be arranged at an identical layer and directly connected thereto.

In addition, in one embodiment of the present disclosure, as shown in FIG. 1, the common electrode line 600 is arranged parallel to the gate line 200, and within an identical subpixel, the common electrode 600 and the gate line 200 are arranged at opposite sides of the pixel electrode 400 within the identical subpixel, respectively.

According to the embodiments of the present disclosure, it is able to provide a simpler wiring mode for the array substrate. Of course, it should be appreciated that, the wiring mode of the common electrode line 600 is not limited thereto. For example, within an identical subpixel, the common electrode line 600 and the gate line 200 may be arranged at an identical side of the pixel electrode 400 within the identical subpixel.

In addition, the display performance of a TFT-LCD is closely related to electric fields, but the electric field that is really related to the display performance is an electric field generated by the pixel electrode 400 and the common electrode 700, and the other electric fields should be considered as interference signals that are adverse to the display.

Hence, in one embodiment of the present disclosure, the array substrate further includes a first shielding electrode 601 arranged at a region where the data line 300 is located, and arranged at a layer difference from, and insulated from, the data line 300. The region where the data line 300 is located refers to a position where the data line 300 is located and a region surrounding this position.

According to the embodiment of the present disclosure, the first shielding electrode 601 is arranged at the region where the data line 300 is located, i.e., the first shielding electrode 601 insulated from the data line 300 is arranged at the region where the data line 300 is located on the array substrate. The data line 300 serves as an inductive source and the pixel electrode 400 serves as a sensor. The shielding electrode is added between the inductive source and the sensor so as to prevent an electric field generated by an electric signal on the data line 300 from being transmitted to the pixel electrode 400, i.e., to shield the interference on a voltage across the pixel electrode 400 due to a voltage change of the data line 300, thereby to improve the display quality.

In the above embodiments, it is merely required to arrange the first shielding electrode 601 at the region where the data line 300 is located and between the data line 300 and the pixel electrode 400. To be specific, there may exist the following positional relationships between the first shielding electrode 601 and the data line 300.

The first shielding electrode 601 is arranged right below or above the data line 300, i.e., projections of the first shielding electrode 601 and the data line 300 onto the base substrate 100 completely overlap each other, or a portion of the first shielding electrode 601 is arranged right below or above the data line 300, i.e., the projections of the first shielding electrode 601 and the data line 300 onto the base substrate 100 partially overlap each other, or the first shielding electrode 601 is arranged diagonally above or below the data line 300, i.e., the projections of the first shielding electrode 601 and the data line 300 onto the base substrate 100 do not overlap each other.

Alternatively, the first shielding electrode 601 may be arranged right below or above the data line 300, so as to simultaneously shield the interference signals generated by the data line 300 with respect to the two pixel electrodes 400 adjacent thereto, thereby to provide a simpler structure.

Further, the first shielding electrode 601 may be arranged right below the data line 300. As shown in FIG. 2, usually the pixel electrode 400 and the data line 300 are both arranged on the gate insulating layer 101, and when the first shielding electrode 601 is arranged right below the data line 300, it is able to shield the interference signals in a better manner.

It should be appreciated that, the first shielding electrode 601 may also be arranged at the region where the data line 300 is located, and arranged at a layer identical to, and insulated from, the data line 300.

In addition, in one embodiment of the present disclosure, the first shielding electrode 601 may be connected to the common electrode line 600 directly or through a via-hole. In this way, a signal may be provided directly by the common electrode line 600 to the first shielding electrode 601, so that the first shielding electrode 601 may introduce a coupling signal generated between the first shielding electrode 601 and the data line 300 into the common electrode line, without causing any signal interference on the pixel electrode 400.

Of course, it should be appreciated that, the signal may also be provided to the first shielding electrode 601 via any other signal lines. For example, the first shielding electrode 601 may be grounded, so a parasitic capacitance generated between the first shielding electrode 601 and the data line 300 may be grounded in a short-circuit manner.

Further, as shown in FIG. 1, the first shielding electrode 601 is arranged at an identical layer to, and directly connected to, the common electrode line 600. In this way, it is able to form the first shielding electrode 601 and the common electrode line 600 by a single patterning process, thereby to simplify the manufacture process as well as the structure.

Of course, it should be appreciated that, the first shielding electrode 601 and the common electrode line 600 may also be arranged at different layers and connected to each other through a via-hole.

In addition, in one embodiment of the present disclosure, the array substrate may further include a second shielding electrode arranged at a region where the gate line 200 is located, and arranged at a layer different from, and insulated from, the gate line 200. The region where the gate line 200 is located refers to a position where the gate line 200 is located and a region surrounding this position.

In the above embodiment, the second shielding electrode is arranged at the region where the gate line 200 is located, i.e., the second shielding electrode insulated from the gate line 200 is arranged at the region where the gate line 200 is located on the array substrate. The gate line 200 serves as an inductive source, and the pixel electrode 400 serves as a sensor. The shielding electrode is added between the inductive source and the sensor, so as to prevent an electric field generated by an electric signal on the gate line 200 from being transmitted to the pixel electrode 400, and to shield the electric field by suppressing the coupling of the parasitic capacitance, thereby to improve the display quality.

In the above embodiments, it is merely required to arrange the second shielding electrode at the region where the gate line 200 is located and between the gate line 200 and the pixel electrode 400. To be specific, there may exist the following positional relationships between the second shielding electrode and the gate line 200.

The second shielding electrode is arranged right below or above the gate line 200, i.e., projections of the second shielding electrode and the gate line 200 onto the base substrate 100 completely overlap each other, or a portion of the second shielding electrode is arranged right below or above the gate line 200, i.e., the projections of the second shielding electrode and the gate line onto the base substrate 100 partially overlap each other, or the second shielding electrode is arranged diagonally above or below the gate line 200, i.e., the projections of the second shielding electrode and the gate line 200 onto the base substrate 100 do not overlap each other.

Alternatively, the second shielding electrode may be arranged right below or above the gate line 200, so as to simultaneously shield the interference signals generated by the gate line 200 with respect to the two pixel electrodes 400 adjacent thereto, thereby to provide a simpler structure.

Further, the second shielding electrode may be arranged right above the gate line 200. As shown in FIG. 3, usually the pixel electrode 400 is arranged diagonally above the gate line 200, and when the second shielding electrode is arranged right above the gate line 200, it is able to shield the interference signals in a better manner.

It should be appreciated that, the second shielding electrode may also be arranged at the region where the gate line 200 is located, and arranged at a layer identical to, and insulated from, the gate line 200.

In addition, in one embodiment of the present disclosure, the second shielding electrode may be connected to the common electrode line 600 directly or through a via-hole. In this way, a signal may be provided directly by the common electrode line 600 to the second shielding electrode, so that the second shielding electrode may introduce a coupling signal generated between the second shielding electrode and the gate line 200 into the common electrode line, without causing any signal interference on the pixel electrode 400.

Of course, it should be appreciated that, the signal may also be provided to the second shielding electrode via any other signal lines. For example, the second shielding electrode may be grounded, so a parasitic capacitance generated between the second shielding electrode and the gate line s00 may be grounded in a short-circuit manner.

Further, in one embodiment of the present disclosure, the first shielding electrode 601 is arranged at an identical layer to, and directly connected to, the common electrode line 600, and the common electrode line 500 is arranged at an identical layer to the gate line 200. The second shielding electrode is arranged at an identical layer to the data line 300, and connected to the first shielding electrode 601 through a via-hole in the gate insulating layer 101 between the first shielding electrode 601 and the second shielding electrode, so that the second shielding electrode is connected to the common electrode line 600.

Of course, it should be appreciated that, in actual application, an arrangement mode of the second shielding electrode is not limited thereto, and any other arrangement modes may also be adopted. For example, the first shielding electrode 601 and the second shielding electrode may be formed by a single patterning process and directly connected to each other.

Alternatively, the first shielding electrode 601 is arranged at an identical layer to, and directly connected to, the common electrode line 600, and the common electrode line 600 is arranged at an identical layer to the gate line 200. The second shielding electrode is arranged at an identical layer to the common electrode line 600, and connected to the first shielding electrode 601, so that the second shielding electrode is connected to the common electrode line 600.

In addition, in the embodiments of the present disclosure, there may exist the following positional relationships between the common electrode 700 within the subpixel provided with the common electrode line 600 and the corresponding data lines 300 and/or gate lines 200.

Figure 4:
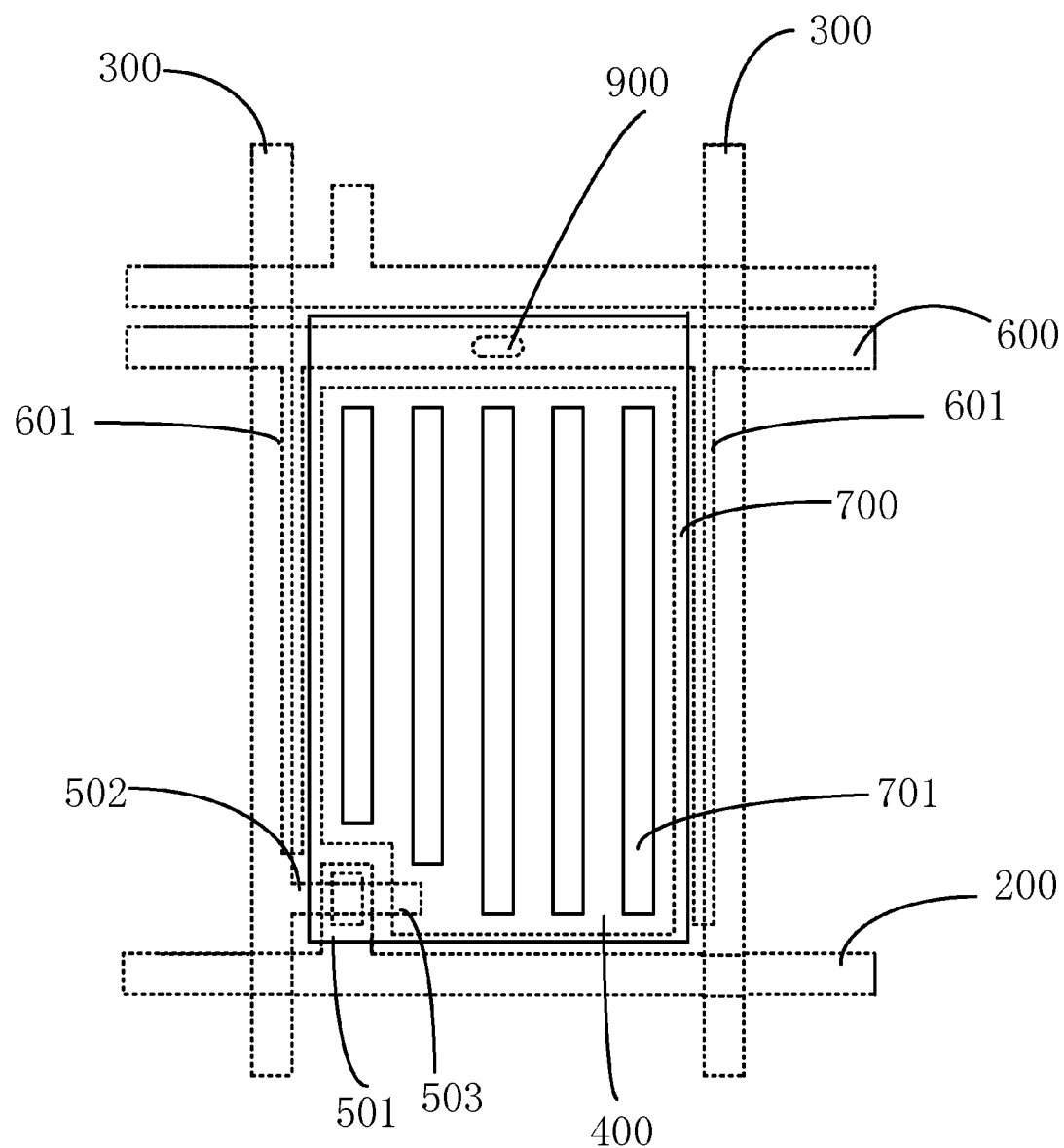
FIG. 4 is a schematic view showing one subpixel of the array substrate according to another embodiment of the present disclosure.
Figure 5:
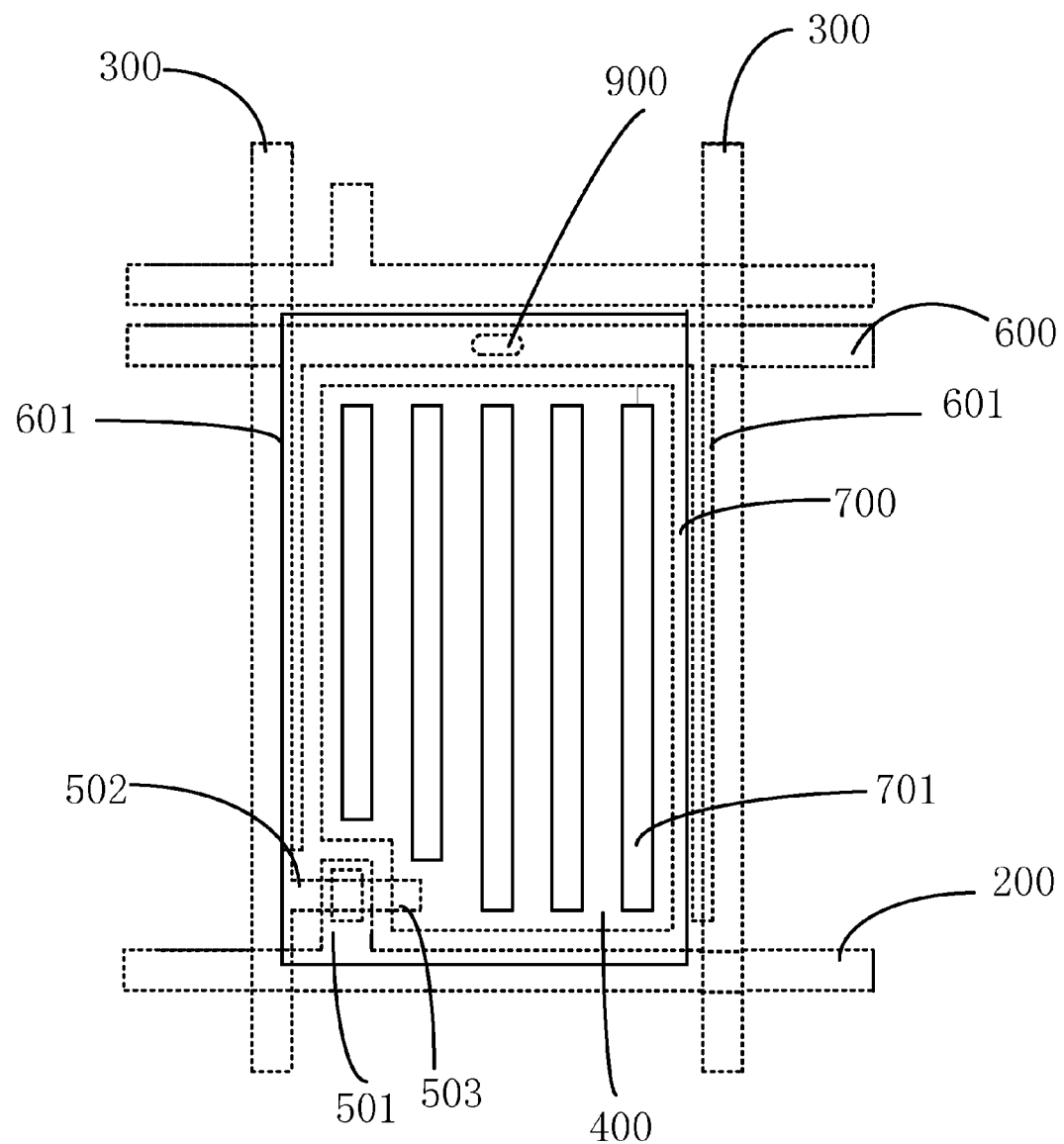
FIG. 5 is a schematic view showing one subpixel of the array substrate according to yet another embodiment of the present disclosure.

As shown in FIG. 1, the common electrode 700 within the subpixel provided with the common electrode line 600 completely covers the corresponding data lines 300 and/or gate lines 200 defining the subpixel, i.e., the common electrode 700 completely covers the data lines 300 and/or gate lines 200 around it. Or, as shown in FIG. 5, the common electrode 700 within the subpixel provided with the common electrode line 600 partially covers the corresponding data lines 300 and/or gate lines 200 defining the subpixel, i.e., the common electrode 700 partially covers the data lines 300 and/or gate lines 200 around it. Or, as shown in FIG. 4, the common electrode 700 within the subpixel provided with the common electrode line 600 does not cover the corresponding data lines 300 and/or gate lines 200 defining the subpixel, i.e., the common electrode 700 does not cover the data lines 300 and/or gate lines 200 around it.

Alternatively, the common electrode 700 may completely cover the data lines 300 and/or gate lines 200 around it, so as to simultaneously shield the interference on the voltage across the pixel electrode 400 due to a voltage change of the data line 300 and/or gate line 200, thereby to further improve the display quality.

Figure 8:
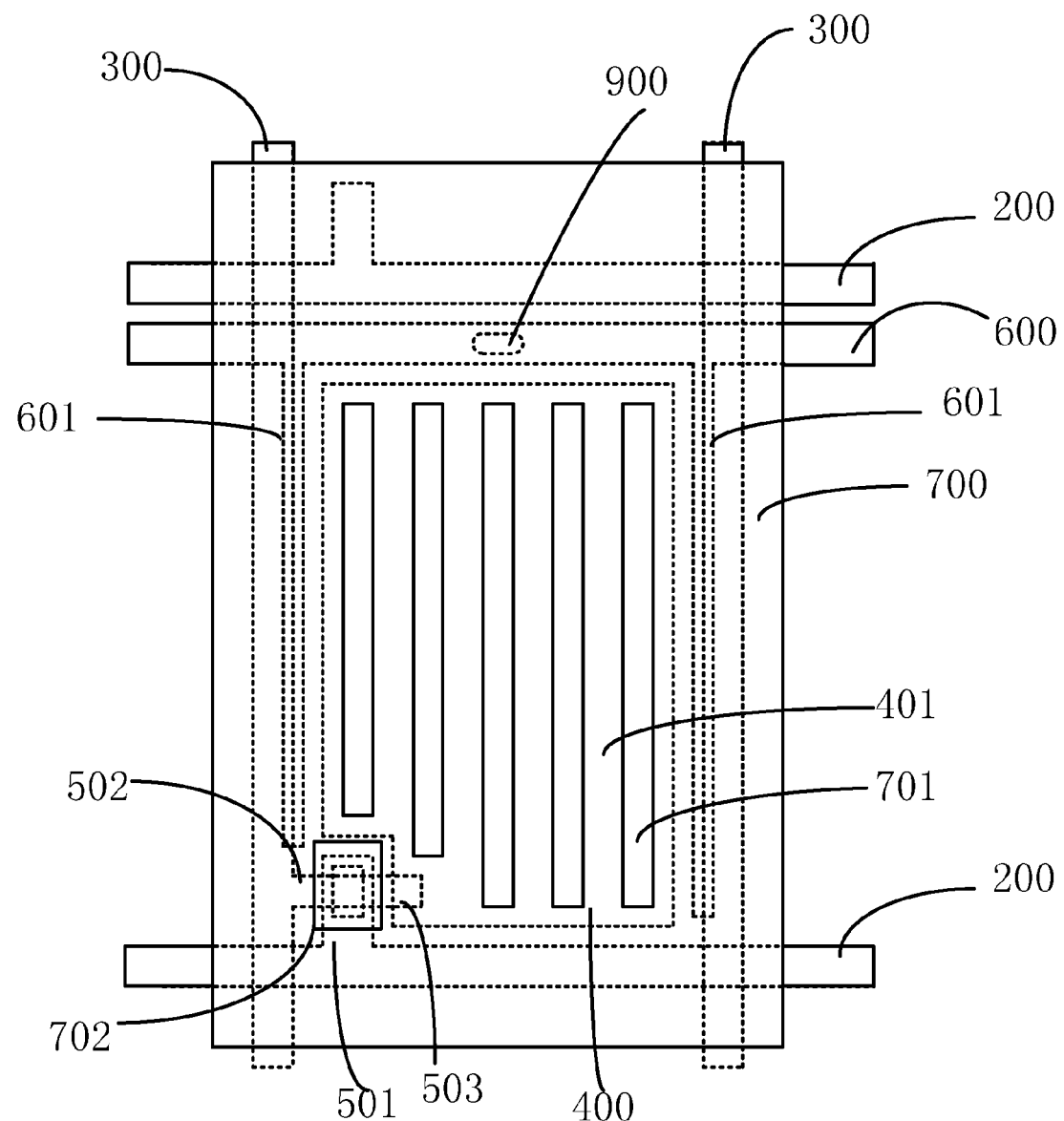
FIG. 8 is a schematic view showing one subpixel of the array substrate according to still yet another embodiment of the present disclosure.

In addition, in one embodiment of the present disclosure, as shown in FIG. 8, the common electrode 700 is provided with a cutout 702 at a position corresponding to the TFT within an identical subpixel. Through the cutout 702 of the common electrode 700 arranged above the TFT, it is able to reduce a parasitic capacitance between the common electrode 700 and the TFT, thereby to further improve the display quality.

Figure 6:
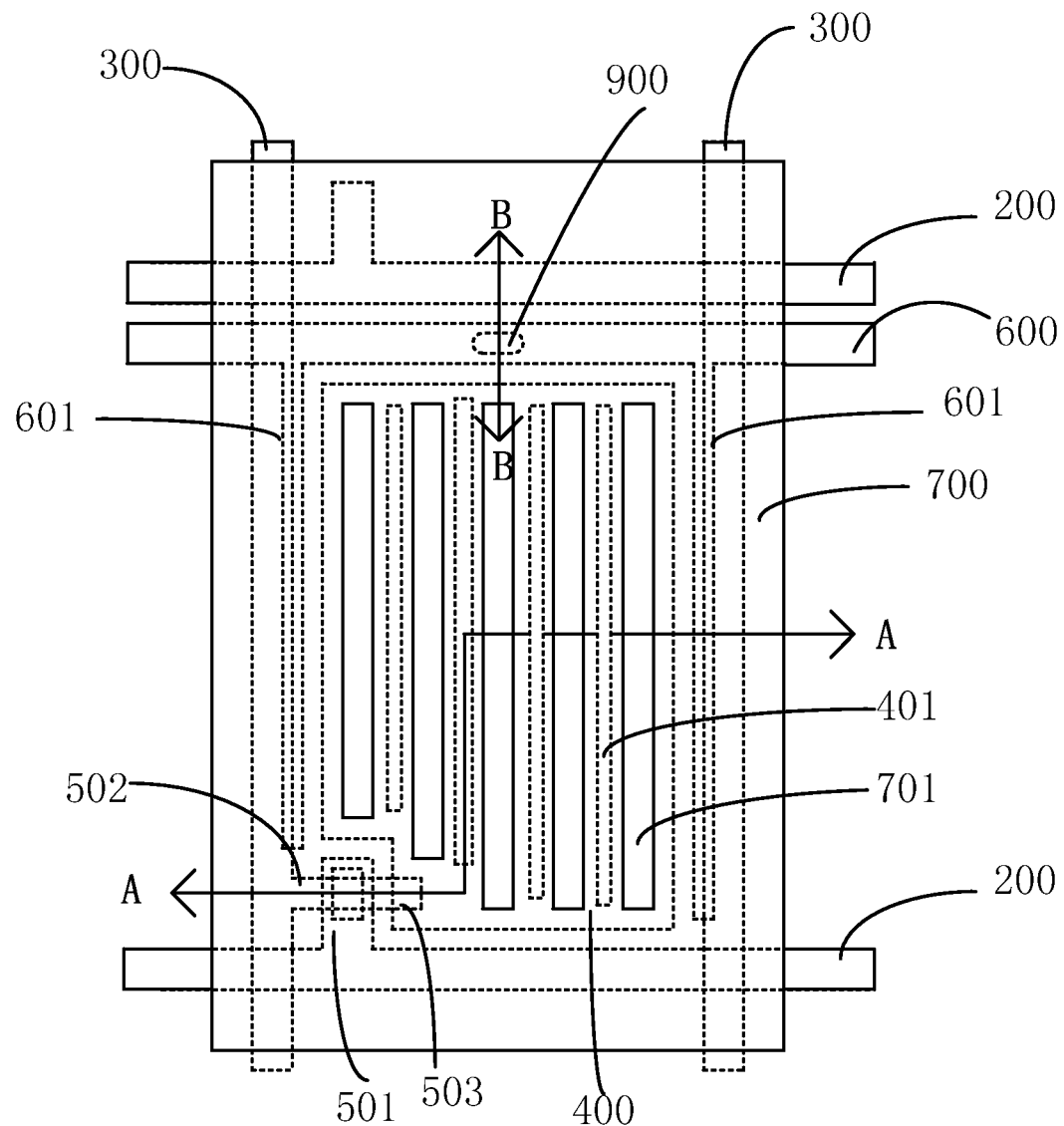
FIG. 6 is a schematic view showing one subpixel of the array substrate according to still yet another embodiment of the present disclosure.
Figure 7:
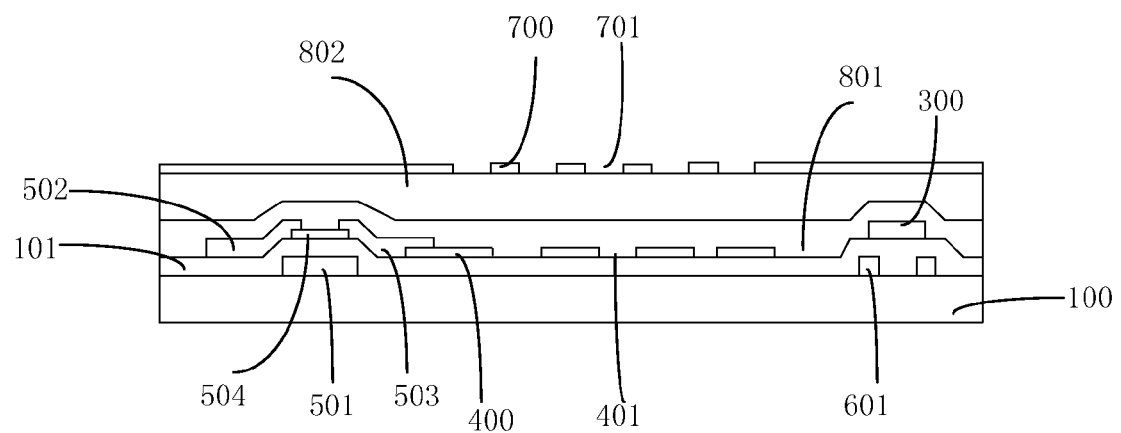
FIG. 7 is a sectional view along line A-A in FIG. 6.

In addition, the array substrate in the embodiments of the present disclosure may be an FFS array substrate. The common electrode 700 may be provided with a first slit 701, and the pixel electrode 400 may be provided with a second slit 401 (as shown in FIGS. 6 and 7) or the pixel electrode 400 may be a plate-like electrode (as shown in FIGS. 1-5).

The following is an illustrative example for the array substrate.

As shown in FIGS. 1-3, the array substrate includes: the base substrate 100; the gate line 200, the gate electrode 501, the common electrode line 600 and the first shielding electrode 601 on the base substrate 100 at an identical layer, the gate line 200 being connected to the gate electrode 501, and the common electrode line 600 being connected to the first shielding electrode 601; the gate insulating layer 101 covering the gate line 200, the gate electrode 501, the common electrode line 600 and the first shielding electrode 601; the pixel electrode 400 formed on the gate insulating layer 101; an active layer 504 formed on the gate insulating layer 101; the source electrode 502, the drain electrode 503 and the data line 300 formed on the gate insulating layer 101, the data lines 300 and the gate lines 200 being arranged in a crisscross manner to define a plurality of subpixels, the pixel electrode 400 being arranged within the subpixel, the data line 300 being located above the first shielding electrode 601, the source electrode 502 and the drain electrode 503 being arranged at and connected to both sides of the active layer 504, respectively, the source electrode 502 being connected to the data line 300, and the drain electrode 503 being connected to the pixel electrode 400; the passivation layer 801 covering the source electrode 502, the drain electrode 503, the data line 300 and the pixel electrode 400; the planarization layer 802 covering the passivation layer 801, a via-hole 900 being formed in the gate insulating layer 101, the passivation layer 801 and the planarization layer 802 at a position corresponding to the common electrode line 600; and the common electrode 700 formed on the planarization layer 802 and above the pixel electrode 400, the common electrode 700 being connected to the common electrode line 600 through the via-hole 900 in the gate insulating layer 101, the passivation layer 801 and the planarization layer 802, and the common electrode 700 being provided with the first slit 701.

In the array substrate according to the embodiment of the present disclosure, the gate line 200, the common electrode line 600 and the data line 300 may be made of metal (e.g., Cu, Al, Mn, Ti, Cr or W), or an alloy thereof. The gate line 200 may be of a single-layered or multi-layered structure. The gate insulating layer 101 may be made of SiN or SiOx, and be of a single-layered or multi-layered structure. The active layer may be made of a-Si or an oxide semiconductor. The passivation layer 801 may be made of an inorganic substance, e.g., SiN. The planarization layer 802 may be made of an organic substance, e.g., resin. The pixel electrode 400 may be made of ITO, indium zinc oxide (IZO), or any other transparent metal oxide conductive material. The common electrode 700 may be made of ITO, IZO, or any other transparent metal oxide conductive material.

The present disclosure further provides in one embodiment a method for manufacturing the array substrate, which includes steps of: providing the base substrate 100; depositing a metal layer onto the base substrate 100, and forming patterns of the gate lines 200, the gate electrodes 501, the common electrode lines 600 and the first shielding electrodes 601 on the base substrate by a single patterning process; depositing the gate insulating layer 101 onto the base substrate 100 with the gate lines 200, the gate electrodes 501, the common electrode lines 600 and the first shielding electrodes 601; depositing a transparent metal oxide conductive layer onto the gate insulating layer 101, and forming patterns of the pixel electrodes 400 by a single patterning process; depositing a semiconductive layer onto the gate insulating layer 101, and forming a pattern of the active layer by a single patterning process; depositing a metal layer onto the gate insulating layer 101, and forming patterns of the source electrodes 502, the drain electrodes 503 and the data lines 300 by a single patterning process; depositing the passivation layer 801 on the source electrodes 502, the drain electrodes 503, the data lines 300 and the pixel electrodes 400; depositing the planarization layer 802 onto the passivation layer 801, and forming the via-hole 900 in the gate insulating layer 101, the passivation layer 801 and the planarization layer 802 at a position corresponding to the common electrode line 600; and depositing a transparent metal oxide conductive layer onto the planarization layer 802, and forming a pattern of the common electrodes 700 by a single patterning process, the common electrode 700 being connected to the common electrode line 600 through the via-hole 900.

The present disclosure further provides in one embodiment a display panel including a color filter substrate and the above-mentioned array substrate.

The present disclosure further provides in one embodiment a display device including the above-mentioned display panel.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. An array substrate, comprising:
   a base substrate;
   a plurality of gate lines and a plurality of data lines arranged in a crisscross manner on the base substrate to define a plurality of subpixels; and
   a common electrode arranged opposite to each of the plurality of subpixels, wherein
   at least one of the subpixels is provided with a common electrode line connected to the common electrode at an identical subpixel region; and
   the common electrode line arranged at an identical layer to, and insulated from, the gate line, the common electrode line arranged at a layer different from the common electrode and connected to the common electrode through a via-hole in an insulating layer between the common electrode line and the common electrode,
   the array substrate further comprising a first shielding electrode, wherein projections of the first shielding electrode and the data line onto the base substrate completely or partially overlap each other, or do not overlap each other, the first shielding electrode is arranged at an identical layer to, and directly connected to, the common electrode line.

2. The array substrate according to claim 1, further comprising:
   a pixel electrode arranged within each of the plurality of subpixels; and
   a thin film transistor (TFT) arranged within each of the plurality of subpixels and connected to the corresponding data line, gate line, and pixel electrode.

3. The array substrate according to claim 1, wherein a structure of the common electrode and the common electrode line is alternately arranged within the plurality of the subpixels in each row.

4. The array substrate according to claim 2, wherein the common electrode line is arranged parallel to the gate line, and within an identical subpixel, the common electrode line and the gate line are arranged at opposite sides, or an identical side, of the pixel electrode.

5. The array substrate according to claim 1, wherein the first shielding electrode is arranged at a layer different from the common electrode line, and connected to the common electrode line through a via-hole.

6. The array substrate according to claim 1, wherein the first shielding electrode is arranged at an identical layer to, and insulated from, the data line.

7. The array substrate according to claim 1, further comprising a second shielding electrode, wherein projections of the second shielding electrode and the gate line onto the base substrate completely or partially overlap each other, or do not overlap each other.

8. The array substrate according to claim 7, wherein the second shielding electrode is arranged at an identical layer to, and connected to, the common electrode line.

9. The array substrate according to claim 7, wherein the second shielding electrode is arranged at an identical layer to, and insulated from, the gate line.

10. The array substrate according to claim 1, wherein the common electrode within the subpixel provided with the common electrode line completely covers the data lines and/or gate lines defining the subpixel.

11. The array substrate according to claim 2, wherein the common electrode is provided with a cutout at a position corresponding to the TFT within an identical subpixel.

12. The array substrate according to claim 2, wherein the common electrode is provided with a first slit, the pixel electrode is provided with a second slit, or the pixel electrode is a plate-like electrode.

13. A display panel comprising a color filter substrate and an array substrate, wherein the array substrate comprises:
  a base substrate;
  a plurality of gate lines and a plurality of data lines arranged in a crisscross manner on the base substrate to define a plurality of subpixels;
  a common electrode arranged opposite to each of the plurality of subpixels; and
  a first shielding electrode, wherein:
    at least one of the subpixels is provided with a common electrode line connected to the common electrode at an identical subpixel region; projections of the first shielding electrode and the data line onto the base substrate completely or partially overlap each other, or do not overlap each other; and
    the first shielding electrode is arranged at a layer different from the common electrode line and connected to the common electrode line through a via-hole.

14. A display device comprising a display panel, wherein the display panel comprises an array substrate, the array substrate comprising:
  a base substrate;
  a plurality of gate lines and a plurality of data lines arranged in a crisscross manner on the base substrate to define a plurality of subpixels;
  a common electrode arranged opposite to each of the plurality of subpixels; and
  a first shielding electrode, wherein:
    at least one of the subpixels is provided with a common electrode line connected to the common electrode at an identical subpixel region; projections of the first shielding electrode and the data line onto the base substrate completely or partially overlap each other, or do not overlap each other; and
    the first shielding electrode is arranged at an identical layer to, and insulated from, the data line;
  the array substrate further comprising a second shielding electrode, wherein projections of the second shielding electrode and the gate line onto the base substrate completely or partially overlap each other, or do not overlap each other, the second shielding electrode arranged at an identical layer to, and connected to, the common electrode line.

15. A method for manufacturing an array substrate, comprising:
  providing a base substrate;
  forming patterns of gate lines and gate electrodes on the base substrate;
  forming a pattern of data lines;
  forming a pattern of common electrode lines at a pixel region surrounded by the patterns of the gate lines and data lines;
  forming a pattern of a passivation layer on the pattern of the common electrode lines; and
  forming a pattern of common electrodes on the pattern of the passivation layer, the common electrodes being each connected to the common electrode line through a via-hole;
  wherein the array substrate comprises:
    the base substrate;
    a plurality of the gate lines and a plurality of the data lines arranged in a crisscross manner on the base substrate to define a plurality of subpixels; and
    the common electrode arranged opposite to each of the plurality of subpixels,
  wherein at least one of the subpixels is provided with the common electrode line connected to the common electrode at an identical subpixel region; and
  wherein the common electrode line is arranged at an identical layer to, and insulated from, the gate line, and the common electrode line is arranged at a layer different from the common electrode and connected to the common electrode through the via-hole in an insulating layer between the common electrode line and the common electrode;
  the array substrate further comprising a first shielding electrode, wherein projections of the first shielding electrode and the data line onto the base substrate completely or partially overlap each other, or do not overlap each other, the first shielding electrode arranged at an identical layer to, and directly connected to, the common electrode line.

16. The method according to claim 15, wherein the forming the patterns of the gate lines and gate electrodes on the base substrate includes forming a pattern of a first shielding electrode.

17. The method according to claim 16, further comprising:
  forming the common electrode line, the gate lines, the gate electrodes and the first shielding electrodes by a single patterning process;
  depositing a gate insulating layer onto the base substrate with the gate lines, the gate electrodes, the common electrodes and the first shielding electrodes;
  depositing a transparent metal oxide conductive layer onto the gate insulating layer, and forming a pattern of pixel electrodes by a single patterning process;
  depositing a semiconductive layer onto the gate insulating layer, and forming a pattern of an active layer by a single patterning process; depositing a metal layer onto the gate insulating layer, and forming patterns of a source electrode, a drain electrode and the data lines by a single patterning process;
  depositing the passivation layer onto the source electrode, the drain electrode, the data lines and the pixel electrode;

depositing a planarization layer onto the passivation layer, and forming a via-hole in the gate insulating layer, the passivation layer and the planarization layer at a position corresponding to the common electrode line by a single patterning process, wherein the insulating layer comprises the gate insulating layer, the passivation layer and the planarization layer; and depositing the transparent metal oxide conductive layer onto the planarization layer, and forming the pattern of the common electrodes by a single patterning process, the common electrodes being each connected to the common electrode line through the via-hole.

18. The array substrate according to claim 1, wherein the common electrode within the subpixel including the common electrode line partially covers the data lines and/or gate lines defining the subpixel.

19. The array substrate according to claim 1, wherein the common electrode within the subpixel including the common electrode line does not cover the data lines and/or gate lines defining the subpixel.

* * * * *